(12) United States Patent
Matalon

(10) Patent No.: US 7,714,655 B2
(45) Date of Patent: May 11, 2010

(54) CLOSED LOOP SURGE PROTECTION TECHNIQUE FOR DIFFERENTIAL AMPLIFIERS

(75) Inventor: Nir Matalon, Sunnyvale, CA (US)

(73) Assignee: Broadcom Corporation, Irvine, CA (US)

( * ) Notice: Subject to any disclaimer, the term of this patent is extended or adjusted under 35 U.S.C. 154(b) by 12 days.

(21) Appl. No.: 12/117,987

(22) Filed: May 9, 2008

(65) Prior Publication Data

US 2009/0278602 A1    Nov. 12, 2009

(51) Int. Cl.
*H03F 3/45*    (2006.01)
(52) U.S. Cl. .................................................. 330/255
(58) Field of Classification Search .......... 330/252–261

See application file for complete search history.

(56) References Cited

U.S. PATENT DOCUMENTS 7,489,199 B2 *    2/2009    Szepesi .................... 330/298

* cited by examiner

*Primary Examiner*—Robert Pascal
*Assistant Examiner*—Hieu P Nguyen
(74) *Attorney, Agent, or Firm*—Fiala & Weaver P.L.L.C.

(57) ABSTRACT

A differential amplifier with surge protection is described. The differential amplifier includes a first output driver device, a second output driver device, a first replica device, a second replica device, a current comparator, and a clamp circuit. The first replica device is configured to be a replica of the first output driver device. The second replica device is configured to be a replica of the second output driver device. The current comparator is configured to generate a threshold current, and to compare the threshold current to a first current through the first replica device and a second current through the second replica device. The clamp circuit is configured to limit a third current through the first output driver device and a fourth current through the second output driver device if the current comparator determines that the threshold current is greater than the first current or the second current.

27 Claims, 6 Drawing Sheets

100

100

CLOSED LOOP SURGE PROTECTION TECHNIQUE FOR DIFFERENTIAL AMPLIFIERS

BACKGROUND OF THE INVENTION

1. Field of the Invention

The present invention relates to surge protection for amplifiers.

2. Background Art

An amplifier is a device used for increasing the power and/or amplitude of a signal. Different types of amplifiers exist, with each amplifier type defined as an amplifier "class." Example amplifier classes include class A, which is a more linear, less complex, and less power efficient class of amplifier, and classes A/B, B, C, D, etc., which are less linear and more complex than class A amplifiers, but are more power efficient. Such amplifiers may be used many types of applications.

Line drivers, power amplifiers and further amplifier circuits often drive very high power signals onto very low ohmic loads, such as antennas, phone lines, cables, and other such media. Due to the high power nature of these circuits, amplifier classes other than class A (e.g., class A/B, B, C, D, etc.) may be desirable to achieve high power efficiency. For class A differential amplifiers, the maximum load current is limited by a fixed current source. For higher class amplifiers, output current values are governed by the resistive load and the signal amplitude level.

In many wired applications, the signal lines driven by these amplifiers can be disconnected or connected at will by a user or technician independent of whether the amplifier is transmitting. As a result, a potential exists that the signal line will be accidentally shorted, causing a momentary surge in current. This shorting may cause permanent damage to the amplifier integrated circuit chip due to a resulting large power dissipation by the amplifier, or device breakdown. Even in line driver applications, where many implementations utilize line impedance back-match resistors, an accidental short may still result in dissipation of twice the line power, and may potentially damage the amplifier integrated circuit chip. Thus, ways for avoiding damage to amplifiers due to such shorting are desired.

BRIEF SUMMARY OF THE INVENTION

Methods, systems, and apparatuses for limiting an amplifier output current are provided. A clamp circuit is configured to operate when an output current of an amplifier exceeds a designated threshold. The clamp circuit limits the amount of output current that may be supplied by the amplifier. In this manner, amplifiers may be protected from short circuits at their outputs, for example.

In an example aspect of the present invention, a first current is enabled to flow through a first replica device that is configured to be a replica of a first output driver device of an amplifier. A second current is enabled to flow through a second replica device that is configured to be a replica of a second output driver device of the amplifier. A threshold current is compared to the first current and the second current. At least one of a third current through the first output driver device or a fourth current through the second output driver device is limited if the threshold current is greater than at least one of the first current or the second current.

In another example aspect of the present invention, a differential amplifier with surge protection is described. The differential amplifier includes a first output stage that includes a first output driver device, a second output stage that includes a second output driver device, a first replica device, a second replica device, a current comparator, and a clamp circuit. The first replica device is configured to be a replica of the first output driver device. The second replica device is configured to be a replica of the second output driver device. The current comparator is configured to generate a threshold current, and to compare the threshold current to a first current through the first replica device and a second current through the second replica device. The clamp circuit is configured to limit a third current through the first output driver device and a fourth current through the second output driver device if the current comparator determines that the threshold current is greater than the first current or the second current.

These and other objects, advantages and features will become readily apparent in view of the following detailed description of the invention. Note that the Summary and Abstract sections may set forth one or more, but not all exemplary embodiments of the present invention as contemplated by the inventor(s).

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
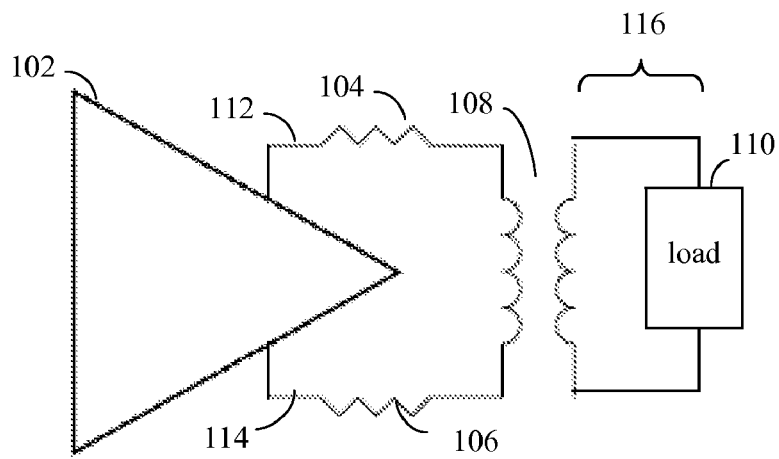
FIG. 1 shows a line driver circuit that includes a differential amplifier configured to drive an output signal onto a signal line.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Introduction

The present specification discloses one or more embodiments that incorporate the features of the invention. The disclosed embodiment(s) merely exemplify the invention. The scope of the invention is not limited to the disclosed embodiment(s). The invention is defined by the claims appended hereto.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein can be spatially arranged in any orientation or manner.

Conventional Amplifier Configurations

An amplifier is a device for increasing the power and/or amplitude of a signal. Different types of amplifier types exist, with each type defined as an amplifier "class." Example amplifier classes include class A, which is a more linear, less complex, and less power efficient class of amplifier, and classes A/B, B, C, D, etc., which are less linear and more complex than class A amplifiers, but are more power efficient. Such amplifiers may be used many types of applications.

Line drivers, power amplifiers and similar integrated circuits often drive very high power signals onto very low ohmic loads, such as antennas, phone lines, cables, and other such media. For example, FIG. 1 shows a line driver circuit 100 that includes a differential amplifier 100 configured to drive an output signal onto a signal line 116. As shown in FIG. 1, differential amplifier 100 has first and second outputs 112 and 114 that are coupled to signal line 116 through corresponding first and second resistors 104 and 106. First and second resistors 104 and 106 are back-matched resistors that may be used in a typical line driver circuit. A 1:M transformer 108 is coupled across signal line 116. Differential amplifier 100 is configured to drive an output signal onto signal line 116 into a load 110.

Differential amplifier 102 may be any class of amplifier, including class A, class A/B, Class B, class C, etc. Due to a high power nature of line driver circuit 100, differential amplifier 102 may be configured according to a higher amplifier class than class A, such as one of classes A/B, B, C, D, etc., to achieve a high power efficiency. In a class A amplifier, the maximum current is limited by a fixed current source. For higher class amplifiers, an output current value for differential amplifier 110 is governed by the resistive value of load 110, and the amplitude level of the signal driven by differential amplifier 110.

Figure 2:
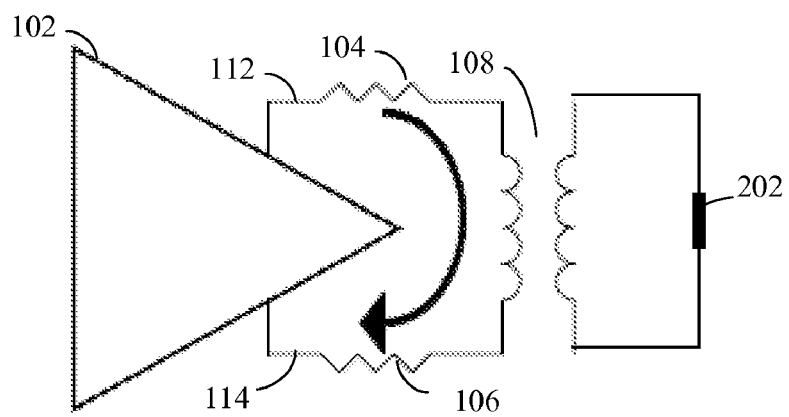
FIG. 2 shows the line driver circuit of FIG. 1 with the signal line having a short circuit.

In many wired applications, such as in modems (e.g., digital subscriber line (DSL) modems), signal line 116 driven by differential amplifier 102 can be disconnected or connected at will by a user or technician independent of whether differential amplifier 102 is transmitting. As a result, a potential exists that signal line will be shorted, causing a momentary surge in current. For example, FIG. 2 shows line driver circuit 100 of FIG. 1, with signal line 116 having a short circuit 202. Short circuit 202 can cause differential amplifier 102 to drive a large amount of current between outputs 112 and 114. This shorting may cause permanent damage to the integrated circuit chip in which differential amplifier 102 is fabricated due to a resulting large power dissipation or device breakdown. Even in line driver applications, such as FIGS. 1 and 2, where many implementations utilize line impedance back-match resistors (e.g., resistors 104 and 106), an accidental short may still result in dissipation of twice the amount of line power, and may potentially damage the integrated circuit chip of differential amplifier 102. Thus, ways for avoiding damage to differential amplifier 102 due to such shorting are desirable.

Example embodiments are described in the following section that enable damage to amplifiers due to short circuits of their output signal lines to be avoided, without substantially increasing component counts and associated costs.

EXAMPLE EMBODIMENTS

Embodiments of the present invention are described below for short circuit protection for amplifiers. Although such embodiments may be described below with respect to one or more particular classes of amplifiers, such embodiments are applicable to all classes of amplifiers, including class A, class B, class A/B, class C, class D, and further classes of amplifiers.

In an example embodiment, surge protection to prevent damage to amplifiers due to short circuits is implemented using current detection and gain reduction. In an embodiment, such surge protection may be implemented in a digital or analog manner. For example, an analog clamp may be configured to operate when an amplifier output current exceeds a designated threshold. In embodiments, surge protection may be provided for amplifiers based on any type of semiconductor technology, including a combination of thick and thin oxide CMOS (complementary metal-oxide-semiconductor) devices.

Figure 3:
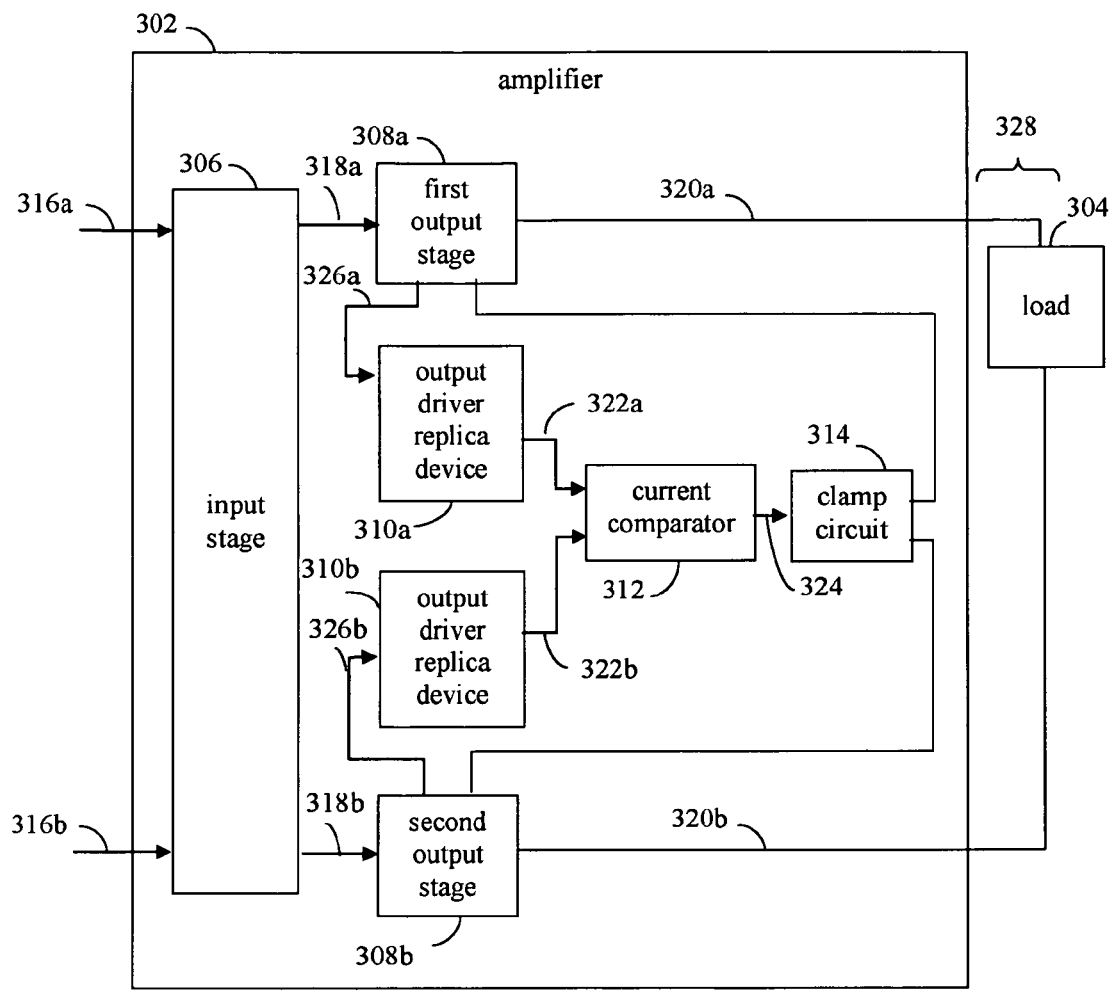
FIG. 3 shows a block diagram of a line driver circuit that has short circuit protection, according to an example embodiment of the present invention.

Such surge protection may be provided in various ways. For instance, FIG. 3 shows a block diagram of a line driver circuit 300 that includes short circuit protection, according to an example embodiment of the present invention. As shown in FIG. 3, line driver circuit 300 includes an amplifier 302 and a signal line 328 that provides a load 304. Amplifier 302 is a differential amplifier. Signal line 328 may be any type of signal line, including a transmission line, such as a digital subscriber line (DSL) cable, an Ethernet cable, etc. Load 304 may be any load provided through a signal line, including a resistive load, as would be known to persons skilled in the relevant art(s).

As show in FIG. 3, amplifier 302 includes an input stage 306, a first output stage 308a, a second output stage 308b, a first output driver replica device 310a, a second output driver replica device 310b, a current comparator 312, and a clamp circuit 314. These elements of amplifier 302 may be included in one integrated circuit chip, may be distributed among a plurality of integrated circuit chips, or may be distributed among any number of integrated circuit chips and separate discrete devices (e.g., resistors, capacitors, etc.). These elements of amplifier 302 are described as follows.

Input stage 306 and first and second output stages 308a and 308b are input and output stages that may be present in a conventional differential amplifier. Output stages 308a and 308b may be positive and negative portions, respectively, of a fully differential output stage of amplifier 302 that is implemented with two single-ended amplifiers. Input stage 306 and first and second output stages 308a and 308b may be configured as input and output stages for any class of amplifier, including class A, class B, class A/B, class C, class D, and/or further class of amplifier, as would be known to persons skilled in the relevant art(s).

Input stage 306 is a differential stage that receives differential first and second input signals 316a and 316b, and generates first and second input signals 318a and 318b for output stages 308a and 308b, respectively. Input stage 306 may provide a high input impedance and low noise amplification for differential input signals 316a and 316b, to generate output stage input signals 318a and 318b. Input stage 306 may also provide a high voltage gain. Input stage 306 may be implemented in any manner, including using analog circuitry (e.g., transistors, resistors, and/or other devices), as would be known to persons skilled in the relevant art(s).

First output stage 308a receives output stage input signal 318a and generates a first output signal 320a, and second output stage 308b receives output stage input signal 318b and generates a second output signal 320b. First and second output signals 320a and 320b form a differential output signal for amplifier 302 used to drive signal line 328. First and second output stages 308a and 308b each provide current driving capability (at a low output impedance) as would be known to persons skilled in the relevant art(s). Output stages 308a and 308b may be implemented in any manner, including using analog circuitry (e.g., transistors, resistors, and/or other devices), as would be known to persons skilled in the relevant art(s).

Figure 4:
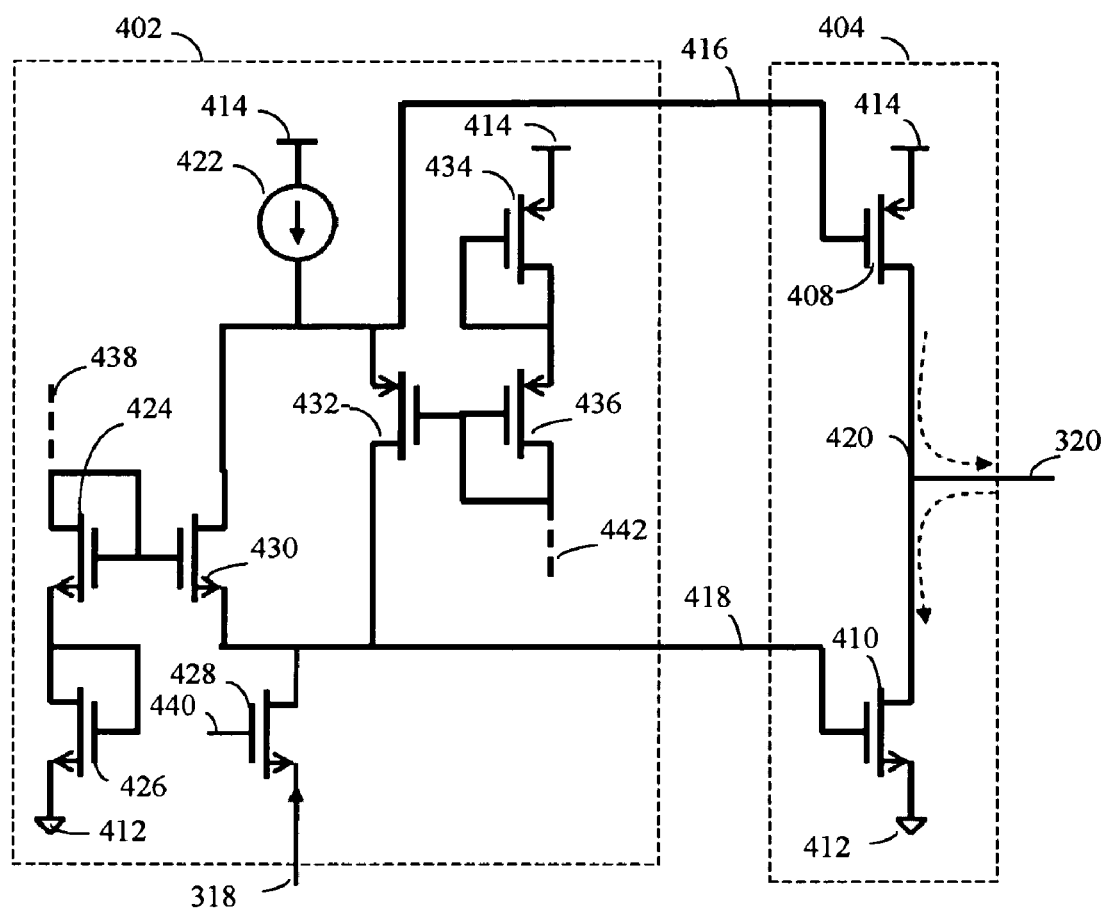
FIG. 4 shows an output stage, according to an example embodiment of the present invention.

For instance, FIG. 4 shows an output stage 400, according to an example embodiment of the present invention. As shown in FIG. 4, output stage 400 includes a mesh circuit 402 and an output driver stage 404. Mesh circuit 402 is an example mesh circuit for a class A/B amplifier. Mesh architectures are well known to persons skilled in the relevant art(s). Because mesh circuits are well known, a portion of a mesh circuit is shown in FIG. 4 for mesh circuit 402 for reasons of brevity.

In an embodiment, each of first and second output stages 308a and 308b may be implemented in a similar manner as output stage 400 shown in FIG. 4. Note that output stage 400 is provided for purposes of illustration, and is not intended to be limiting. In further embodiments, first and second output stages 308a and 308b may be implemented in other ways, as would be known to persons skilled in the relevant art(s). Output stage 400 shown in FIG. 4 is described as follows.

Mesh circuit 402 includes a current source 422, a first transistor 424, a second transistor 426, a third transistor 428, a fourth transistor 430, a fifth transistor 432, a sixth transistor 434, and a seventh transistor 436. First-seventh transistors 424, 426, 428, 430, 432, 434, and 436 are MOSFETs (metal-oxide-semiconductor field effect transistors), with first-fourth transistors 424, 426, 428, and 430 being n-channel MOSFETs (also referred to as NMOS devices) and fifth-seventh transistors 432, 434, and 436 being p-channel MOSFETs (also referred to as PMOS devices).

As shown in FIG. 4, a source terminal of transistor 428 receives input signal 318. As described above, each of first and second output stages 308a and 308b may be implemented in a similar manner as output stage 400. Thus, when first output stage 308a is configured according to output stage 400, the source terminal of transistor 428 in first output stage 308a receives first output stage input signal 318a. When second output stage 308b is configured according to output stage 400, the source terminal of transistor 428 in second output stage 308b receives second output stage input signal 318b. A gate terminal of transistor 428 is coupled to a first signal node 440 of mesh circuit 402.

A source terminal of transistor 426 is coupled to a ground signal 412. A gate terminal and a drain terminal of transistor 426 are coupled together. A source terminal of transistor 424 is coupled to the gate and drain terminals of transistor 426. A gate terminal and a drain terminal of transistor 424, and a gate terminal of transistor 430 are coupled together to a second signal node 438. A first terminal of current source 422 is coupled to a power signal 414. A drain terminal of transistor 430, a second terminal of current source 422, and a source terminal of transistor 432 generate a p-channel driver input signal 416. A drain terminal of transistor 428, a source terminal of transistor 430, and a drain terminal of transistor 432 generate a n-channel driver input signal 418.

A gate terminal of transistor 432, and a gate terminal and a drain terminal of transistor 436 are coupled to a third signal node 442. A gate terminal and a drain terminal of transistor 434 and a source terminal of transistor 436 are coupled together. A source terminal of transistor 434 is coupled to power signal 414.

As shown in FIG. 4, output driver stage 404 includes a first transistor 408 and a second transistor 410. First transistor 408 is a PMOS transistor device, and second transistor 410 is an NMOS transistor device. As shown in FIG. 4, a gate terminal of first transistor 408 receives p-channel driver input signal 416, and a gate terminal of second transistor 410 receives n-channel driver input signal 418. A source terminal of transistor 408 is coupled to power signal 414, and a source terminal of transistor 410 is coupled to ground signal 412. A drain terminal of transistor 408 and a drain terminal of transistor 410 are coupled together at an output driver node 420, which supplies output signal 320. When first output stage 308a shown in FIG. 3 is configured according to output stage 400, output signal 320 is first output signal 320a. When second output stage 308b shown in FIG. 3 is configured according to output stage 400, output signal 320 is second output signal 320b.

With regard to output stage 400, a gate-source voltage for transistor 408 is substantially equal to a gate-source voltage for transistor 434, and a gate-source voltage for transistor 410 is substantially equal to a gate-source voltage for transistor 426. In a quiescent mode, substantially equal current flows through both of transistors 430 and 432 in mesh circuit 402. When input signal 318 (e.g., input signal 318a or 318b of FIG. 3) increases to a relatively high voltage, the NMOS/PMOS portions of mesh circuit 402 are turned off, enabling output driver stage transistors 410/408 to sink/source as much current as necessary, as determined by an amplitude of output signal 320, and by load 304 (shown in FIG. 3). In such a condition, if a short circuit appears at load 304 (e.g., as shown in FIG. 2), transistors 408 and 410 may supply a large amount of current and may become damaged.

Referring back to FIG. 3, output driver replica devices 310a and 310b, current comparator 312, and clamp circuit 314 are configured to provide surge protection for first and second output stages 308a and 308b (which may each include output driver stage 404 shown in FIG. 4). Output driver replica devices 310a and 310b, current comparator 312, and clamp circuit 314 may be implemented in any manner. For example, output driver replica devices 310a and 310b, current comparator 312, and clamp circuit 314 may each include any combination of electrical components/circuits, including resistors, transistors, capacitors, inductors, diodes, etc., to perform their respective functions.

Replica devices 310a and 310b are replica devices for driver devices included in first and second output stages 308a and 308b, respectively. For example, replica devices 310a and 310b may each be a replica device for transistor 408 or for transistor 410 shown in FIG. 4. As shown in FIG. 3, replica device 310a receives a first driver input signal 326a, and replica device 310b receives second driver input signal 326b. For example, when replica devices 310a and 310b each include a respective PMOS transistor 408 shown in FIG. 4, first and second driver input signals 326a and 326b may each be p-channel driver input signal 416 for the respective output stage. When replica devices 310a and 310b each include a respective NMOS transistor 410 shown in FIG. 4, first and second driver input signals 326a and 326b may each be n-channel driver input signal 418 for the respective output stage.

As shown in FIG. 3, replica device 310a generates a first current 322a, and second replica device 310b generates a second current 322b. Because replica devices 310a and 310b are replicas of the original driver devices included in first and second output stages 308a and 308b, and receive first and second driver input signals 326a and 326b, respectively (which also drive the original driver devices), replica devices 310a and 310b each generate an output current (first and second currents 322a and 322b, respectively) that is a replica of an output current of the corresponding original driver device. Thus, if one of the original driver devices is shorted, and is providing a surge in output current, the corresponding one of replica devices 310a and 310b will also experience a surge in current (first or second current 322a and 322b, respectively).

Current comparator 312 receives first current 322a and second current 322b. Current comparator 312 compares first current 322a and second current 322b to a threshold current level. Current comparator 312 generates a comparison result signal 324, which indicates whether first current 322a or second current 322b is greater than the threshold current level. If first current 322a or second current 322b is greater than the threshold current level, this indicates that a short circuit may have occurred at load 304, and that surge protection should be implemented. Clamp circuit 314 receives comparison result signal 324. As shown in FIG. 3, clamp circuit 314 is coupled to first output stage 308a and second output stage 308b. If comparison result signal 324 indicates that first current 322a or second current 322b is greater than the threshold current level, clamp circuit 314 clamps first and second output stages 308a and 308b to limit the corresponding output current provided on signal line 328. By limiting the output current, damage to first and second output stages 308a and 308b may be avoided.

Figure 5:
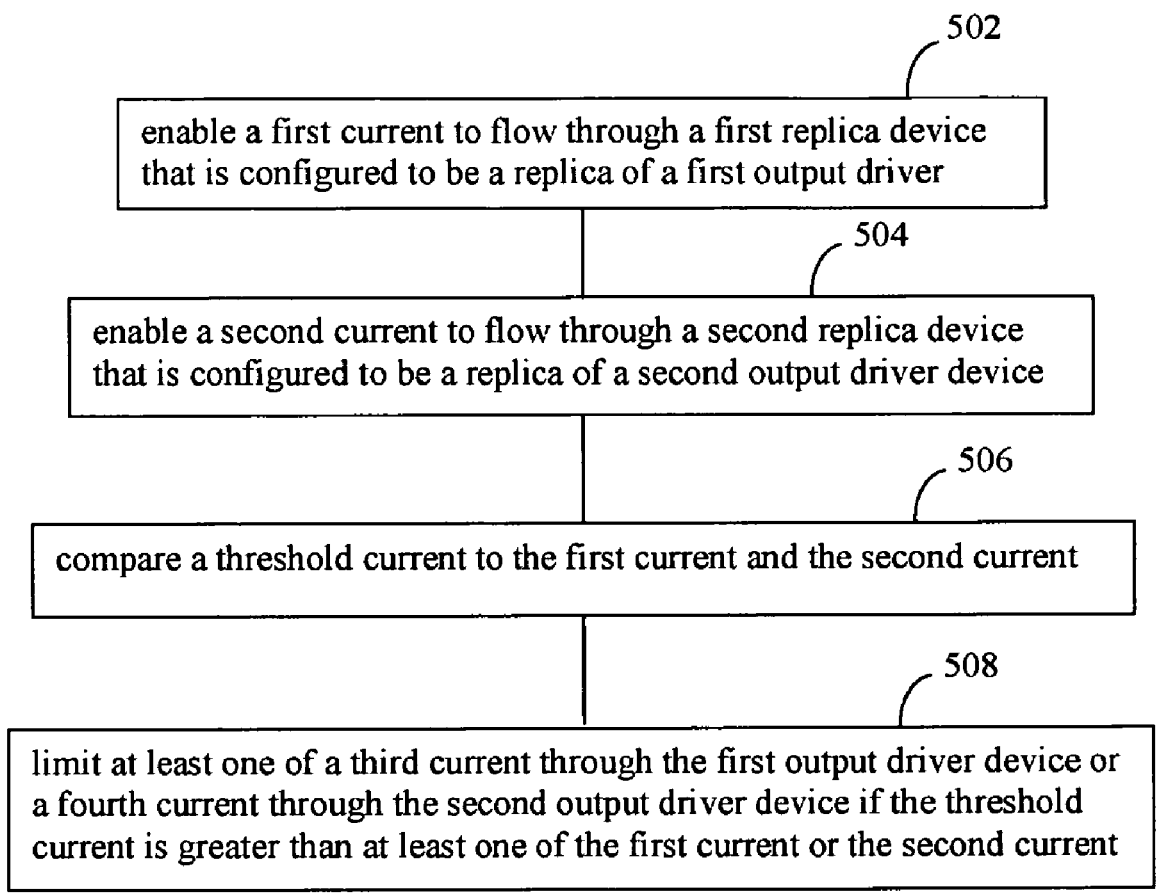
FIG. 5 shows a flowchart for providing short circuit protection to an amplifier, according to an example embodiment of the present invention.

FIG. 5 shows a flowchart 500 for providing short circuit protection to an amplifier, according to an example embodiment of the present invention. Flowchart 500 may be performed by amplifier 302 shown in FIG. 3. Other structural and operational embodiments will be apparent to persons skilled in the relevant art(s) based on the discussion regarding flowchart 500. Flowchart 500 is described as follows.

Flowchart 500 begins with step 502. In step 502, a first current is enabled to flow through a first replica device that is configured to be a replica of a first output driver. In step 504, a second current is enabled to flow through a second replica device that is configured to be a replica of a second output driver device. For example, as described above, replica device 310a may be a replica of a driver device of first output stage 308a, replica device 310b may be a replica of a driver device of second output stage 308b. Replica devices 310a and 310b may be configured as replicas of driver devices of first and second output stages 308a and 308b in various ways.

Figure 6:
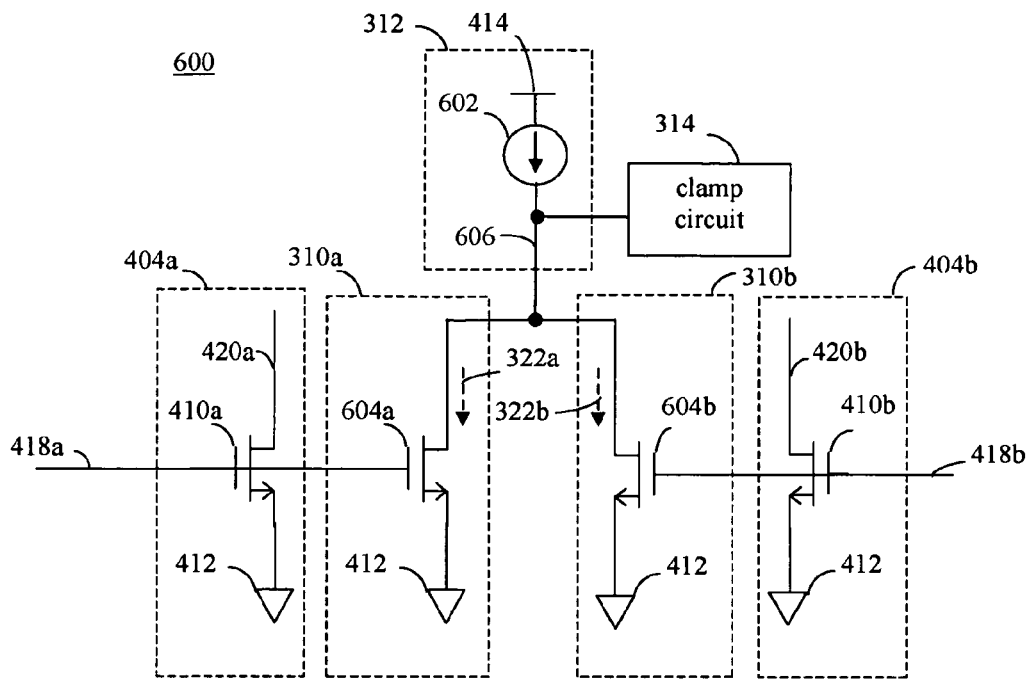
FIGS. 6-8 show surge protection circuits, according to example embodiments of the present invention.

For instance, FIG. 6 shows an example surge protection circuit 600, according to an embodiment of the present invention. Surge protection circuit 600 is an example of the surge protection functionality shown in FIG. 3 for amplifier 302. As shown in FIG. 6, surge protection circuit 600 includes a first output driver stage 404a, a second output driver stage 404b, a first replica device 310a, a second replica device 310b, current comparator 312, and clamp circuit 314. In FIG. 6, a portion of first output driver stage 404 shown in FIG. 4 is shown included in each of first and second output driver stages 404a and 404b. First output driver stage 404a includes transistor 410a and second output driver stage 404b includes transistor 410b.

As shown in FIG. 6, first replica device 310a includes a first transistor 604a and second replica device 310b includes a second transistor 604b. Transistor 604a is a replica of transistor 410a, and transistor 604b is a replica of transistor 410b. For example, as shown in FIG. 6, transistors 604a and 410a are both NMOS devices, and transistors 604b and 410b are both NMOS devices. Furthermore, transistors 604a and 410a may have similar sizes (e.g., same width) to have similar operation, and transistors 604b and 410b may have similar sizes to have similar operation. In another embodiment, transistors 604a and 604b may be scaled replicas of transistors 410a and 410b, respectively. For example, replica transistor 604a may have a width that is less than a width of driver transistor 410a by a predetermined factor, and replica transistor 604b may have a width that is less than a width of driver transistor 410b by a predetermined factor (e.g., by a factor of "X"). By having smaller widths, transistors 604a and 604b can be configured to have similar operation to transistors 410a and 410b, but may conduct less current to reduce power consumption by replica devices 310a and 310b.

As shown in FIG. 6, a source terminal of each of replica transistors 604a and 604b is coupled to ground signal 412. A drain terminal of each of replica transistors 604a and 604b is coupled to a compare node 606. A gate terminal of each of transistors 410a and 604a receives n-channel driver input signal 418a of first output stage 308a, and a gate terminal of each of transistors 410b and 604b receives n-channel driver input signal 418b of first output stage 308b. N-channel driver input signal 418a enables first current 322a to flow through transistor 604a, and n-channel driver input signal 418b enables second current 322b to flow through transistor 604b.

Referring back to flowchart 500, in step 506, a threshold current is compared to the first current and the second current. For example, as shown in FIG. 6, current comparator 312 includes a current source 602 and compare node 606. Current source 602 is configured to generate a threshold current. The threshold current is configured to have a current value that is used to determine whether a short circuit has occurred on signal line 328. For example, in an embodiment, current source 602 may be configured such that the threshold current has a current value that is a maximum current value predetermined to be required to be supplied by amplifier 302 to load 304 (under normal operating conditions). In an embodiment where transistors 604a and 604b are scaled, current source 602 may be scaled in a corresponding fashion. For example, if transistors 604a and 604b are scaled to have a width that is less than a width of transistors 410a and 410b by a factor of X, current source 602 may be configured to provide a current level that is a version of the maximum predetermined current value reduced by the factor of X (e.g., the maximum predetermined current value/X). Current source 602 may be implemented in any suitable manner, including by using a constant voltage source (e.g., a bandgap voltage) and a resistor, or in any other manner, as would be known to persons skilled in the relevant art(s).

Thus, in an embodiment, the threshold current which may be generated by current source 602 is compared to first current 322a and 322b in step 506. For example, in FIG. 6, the comparison occurs at compare node 606, which is coupled to an output of current source 602 and to the drain terminals of replica transistors 604a and 604b. In the embodiment of FIG. 6, compare node 606 performs a comparison of a sum of first and second currents 322a and 322b to the threshold current. During typical operation of amplifier 302, only one of output driver transistors 410a and 410b may be generating significant current at any particular time. As a result, compare node 606 may effectively perform a comparison of the threshold current to one of first and second currents 322a and 322b. During normal operation of amplifier 302 (e.g., a non-short circuit condition for signal line 328), compare node 606 has a relatively high voltage level. During a short circuit condition on signal line 328, compare node 606 has a relatively low voltage level. This characteristic of compare node 606 is described in further detail below.

In step 508 of flowchart 500, at least one of a third current through the first output driver device or a fourth current through the second output driver device is limited if the threshold current is greater than at least one of the first current or the second current. Referring to the example of FIG. 6, as described above, during normal operation of amplifier 302 (e.g., a non-short circuit condition for signal line 328), compare node 606 has a relatively high voltage level. However, if a short circuit is present on signal line 328, the corresponding one of transistors 410a and 410b will conduct a relatively large amount of current. An increase in a gate voltage of transistor 410a or transistor 410b occurs due to the increase in current through transistor 410a or transistor 410b. Accordingly, an increase in a gate voltage of a corresponding one of replica transistors 604a and 604b occurs because the gate terminals of replica transistors 604a and 604b are respectively coupled to the gate terminals of driver transistors 410a and 410b. Furthermore, a decrease in the voltage of compare node 606 occurs due to the increase of the gate voltage of replica transistor 604a or 604b. This decrease in the voltage of compare node 606 is an indication by current comparator 312 that a surge in current has been detected, and that protective action is warranted.

Figure 7:
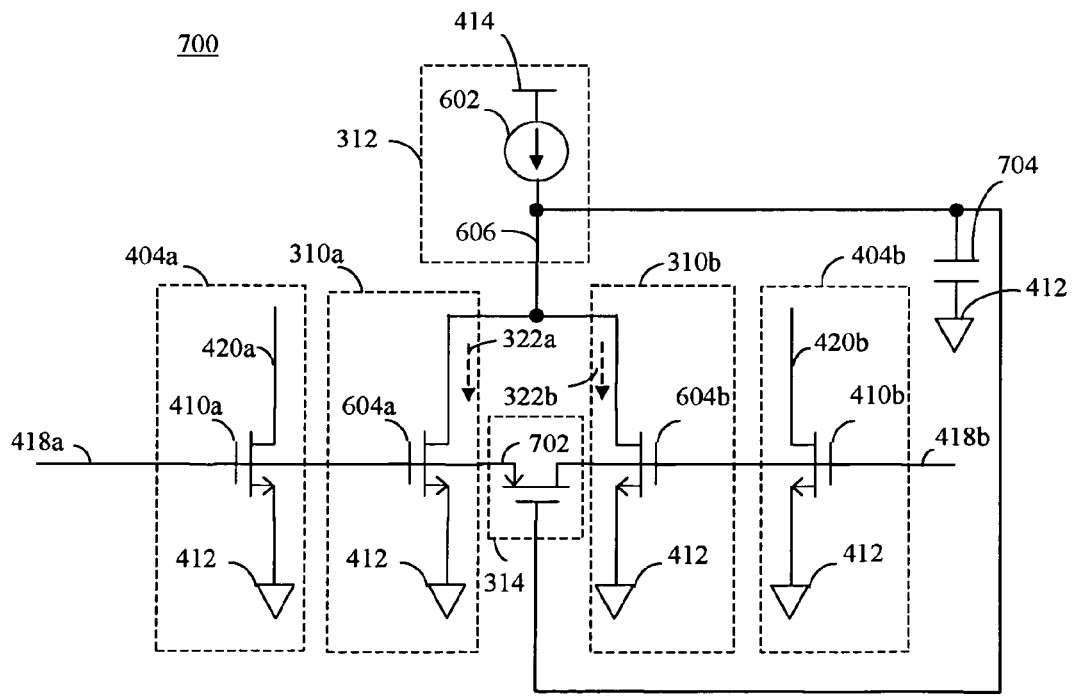

As shown in FIG. 6, an input of clamp circuit 314 is coupled to compare node 606. Clamp circuit 314 is configured to limit a current through transistors 410a and 410b if a sufficient decrease in voltage of compare node 606 is received. Clamp circuit 314 may be configured to limit current through transistors 410a and 410b in various ways. For instance, FIG. 7 shows an example surge protection circuit 700, according to an embodiment of the present invention. Surge protection circuit 700 is generally similar to surge protection circuit 600 shown in FIG. 6, with clamp circuit 314 including a transistor 702. As shown in FIG. 7, transistor 702 is an PMOS transistor device. A gate terminal of transistor 702 is coupled to compare note 606. A source terminal of transistor 702 is coupled to n-channel driver input signal 418a. A drain terminal of transistor 702 is coupled to n-channel driver input signal 418b. In the embodiment of FIG. 7, when compare node 606 is a high voltage (e.g., a non-short circuit condition for signal line 328), transistor 702 is off (non-conducting), to effectively provide an open circuit between the source and drain terminals of transistor 702. When compare node 606 is a sufficiently low level voltage (e.g., a short circuit is present on signal line 328), transistor 702 is on (conductive), to effectively couple together n-channel driver input signal 418a of first output stage 308a and n-channel driver input signal 418b of second output stage 308b. As a result, a negative feedback loop is formed that includes transistors 604a, 604b, and 702. The negative feedback loop includes a single gain stage (formed by replica transistors 604a and 604b) followed by a PMOS source follower (transistor 702).

As shown in FIG. 7, a capacitor 704 may optionally be coupled between compare node 606 and ground signal 412 to provide stabilization for the feedback loop. When capacitor 704 is present, a non-dominant pole is formed by the negative feedback loop, as represented by the following equation:

pole frequency=$Gm_{transistor\ 702}$/value of capacitor 704, where $Gm_{transistor\ 702}$=a transconductance of transistor 702.

Figure 8:
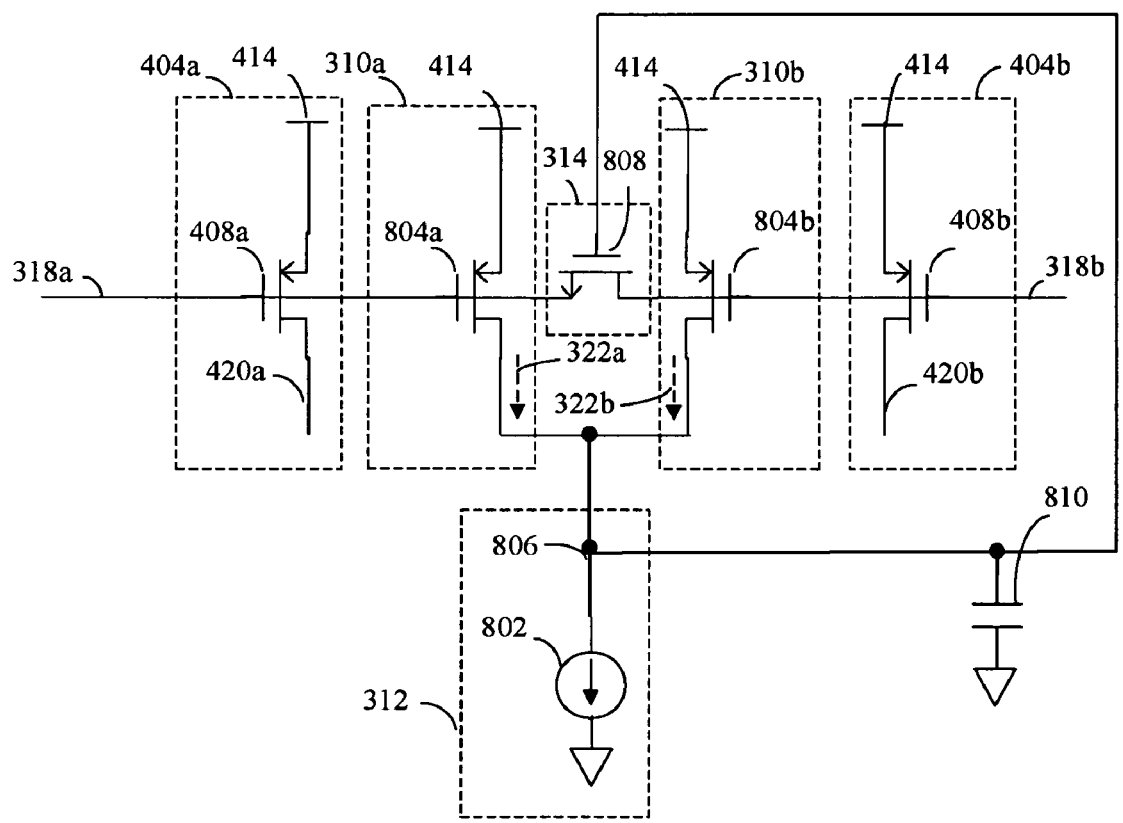

Note that FIGS. 6 and 7 are described with reference to an NMOS device embodiment for replica devices 310a and 310b. In another embodiment, a surge protection circuit implemented with PMOS replica devices included in replica devices 310a and 310b and PMOS driver devices in first and second output stages 308a and 308b. For instance, FIG. 8 shows an example surge protection circuit 800, according to an embodiment of the present invention. Surge protection circuit 800 is generally similar to surge protection circuit 700 shown in FIG. 7, with differences described as follows. Due to the analogous operation to surge protection circuit 700, surge protection circuit 800 is briefly described below. As shown in FIG. 8, surge protection circuit 600 includes first output driver stage 404a, second output driver stage 404b, first replica device 310a, second replica device 310b, current comparator 312, and clamp circuit 314. In FIG. 8, first and second output driver stages 404a and 404b are each shown including a portion of first output driver stage 404 shown in FIG. 4. First output driver stage 404a includes PMOS transistor 408a and second output driver stage 404b includes PMOS transistor 408b.

In the embodiment of FIG. 8, first replica device 310a includes a first transistor 804a and second replica device 310b includes a second transistor 804b. Transistor 804a is a replica of transistor 408a, and transistor 804b is a replica of transistor 408b. For example, transistors 804a and 408a are both PMOS devices, and transistors 804b and 408b are both PMOS devices. Furthermore, transistors 804a and 408a may have similar sizes (e.g., same width), and transistors 804b and 408b may have similar sizes. Alternatively, transistors 804a and 804b may be scaled replicas of transistors 408a and 408b, respectively, as described above (with respect to FIG. 6).

As shown in FIG. 8, a source terminal of each of transistors 804a and 804b is coupled to power signal 414. A drain terminal of each of transistors 804a and 804b is coupled to a compare node 806. A gate terminal of each of transistors 408a and 804a receives p-channel driver input signal 416a of first output stage 308a, and a gate terminal of each of transistors 408b and 804b receives p-channel driver input signal 416b of first output stage 308b.

Current comparator 312 includes a current source 802 and compare node 806. In a similar fashion as described above for current source 602 in FIG. 6, current source 802 is configured to generate a threshold current. The threshold current is configured to have a current value that is used to determine whether a short circuit has occurred on signal line 328. Current source 802 may be implemented in any suitable manner, including by using a constant voltage source (e.g., a bandgap voltage) and a resistor, or in any other manner, as would be known to persons skilled in the relevant art(s).

During normal operation of amplifier 302 (e.g., a non-short circuit condition for signal line 328), compare node 806 has a relatively low voltage level. However, if a short circuit is present on signal line 328, a corresponding one of transistors 408a and 408b will conduct a relatively large amount of current. As a result, a decrease in a gate voltage of the corresponding one of transistors 408a or 408b occurs. Due to the decrease in the gate voltage of the corresponding one of transistors 408a and 408b, a decrease in a gate voltage of a corresponding one of replica transistors 804a and 804b occurs. If the gate voltage of transistor 408a decreases, the gate voltage of transistor 804a will correspondingly decrease, because the gate terminals of transistors 408a and 804a are coupled together. Likewise, if the gate voltage of transistor 408b decreases, the gate voltage of transistor 804b will correspondingly decrease, because the gate terminals of transistors 408b and 804b are coupled together. The decrease of the gate voltage of replica transistor 804a or 804b causes an increase in the voltage of compare node 806. This increase in voltage is due to an increase in first current 322a or 322b through transistor 804a or 804b, which is caused by the decrease in the gate voltage of the corresponding one of transistors 804a and 804b. This increase in the voltage of compare node 806 is an indication by current comparator 312 that a surge in current has been detected, and that protective action is warranted.

In the example of FIG. 8, clamp circuit 314 includes a transistor 808. As shown in FIG. 8, transistor 808 is an NMOS transistor device. A gate terminal of transistor 808 is coupled to compare node 806. A source terminal of transistor 808 is coupled to p-channel driver input signal 416a. A drain terminal of transistor 808 is coupled to p-channel driver input signal 416b. In the embodiment of FIG. 8, when compare node 806 is a low voltage (e.g., a non-short circuit condition for signal line 328), transistor 808 is off (non-conducting), to effectively provide an open circuit between the source and drain terminals of transistor 808. When compare node 806 is a sufficiently high level voltage (e.g., a short circuit is present on signal line 328), transistor 808 is on (conductive), to effectively couple together p-channel driver input signal 416a of first output stage 308a and p-channel driver input signal 416b of second output stage 308b. As a result, a negative feedback loop is formed that includes transistors 804a and 808, or transistors 804b and 808. The negative feedback loop includes a single gain stage (formed by the included one of replica transistors 804a and 804b) followed by an NMOS source follower (transistor 808). As shown in FIG. 8, a capacitor 810 may optionally be coupled between compare node 806 and ground signal 412 to provide stabilization for the feedback loop (in a similar manner as capacitor 704 shown in FIG. 7).

In order to increase speed and performance, line driver circuits often include a combination of thick and thin oxide devices. Thick oxide devices may be able to tolerate the power supply of the integrated circuit chip of the line driver circuit, while thin oxide devices may be desirable to use when higher speeds are of importance. In one example implementation, an output driver device (e.g., transistor 410a shown in FIG. 4) may be preceded by a current source implemented with a thin oxide device (e.g., current source 422 and transistor 428 shown in FIG. 4, in an embodiment). Under normal operating conditions, a gate-source voltage of transistor 410a may vary swing a few hundred millivolts, while the output voltage of transistor 410a (e.g., a drain terminal voltage) may vary by a few volts. If, however, power supply 414 decreases in voltage, when the output voltage of transistor 410a swings low, transistor 410a may enter the triode region, causing the gate-source voltage of transistor 410a to increase very rapidly. This rapid increase in the gate-source voltage of transistor 410a may break down thin oxide current source device 422 that precedes transistor 410a.

However, with surge protection implemented according to an embodiment of the present invention (e.g., as shown in FIGS. 3, 6, and/or 7), such damage to thin oxide current source 422 preceding transistor 410a may be prevented. Even though the threshold current in transistor 410a has not been exceeded, the gate-source voltage of replica transistor 604a begins to rise, thereby turning on clamp circuit 314. Thus, the surge protection circuitry may prevent large current spikes caused by a short circuit in signal line 328, and more fundamentally, may prevent the gate-source voltage of driver transistor 410a from swinging dangerously high.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A differential amplifier, comprising:
a first output stage that includes a first output driver device;
a second output stage that includes a second output driver device;
a first scaled replica device configured to be a replica of the first output driver device;
a second scaled replica device configured to be a replica of the second output driver device;
a current comparator configured to generate a threshold current, and to compare the threshold current to a sum of a first current through the first scaled replica device and a second current through the second scaled replica device; and
a clamp circuit configured to limit at least one of a third current through the first output driver device or a fourth current through the second output driver device if the current comparator determines that the sum of the first current and the second current is greater than the threshold current.

2. The differential amplifier of claim 1, wherein the clamp circuit includes a first transistor having a first terminal coupled to a gate terminal of the first output driver device and a gate terminal of the first scaled replica device, and a second terminal coupled to a gate terminal of the second output driver device and a gate terminal of the second scaled replica device.

3. The differential amplifier of claim 2, wherein the first output driver device, the second output driver device, the first scaled replica device, and the second scaled replica device are transistors;
wherein a gate terminal of the first output driver device and a gate terminal of the first scaled replica device receive a first driver input signal, and a gate terminal of the second output driver device and a gate terminal of the second scaled replica device receive a second driver input signal;
wherein a second terminal of the first output driver device is coupled to a load;
wherein a second terminal of the second output driver device is coupled to the load;
wherein a second terminal of the first scaled replica device is coupled to a compare node of the current comparator; and
wherein a second terminal of the second scaled replica device is coupled to the compare node.

4. The differential amplifier of claim 3, wherein the current comparator includes a current source coupled to the compare node.

5. The differential amplifier of claim 4, wherein a gate terminal of the first transistor is coupled to the compare node.

6. The differential amplifier of claim 5, wherein a third terminal of the first output driver device, a third terminal of the second output driver device, a third terminal of the first scaled replica device, and a third terminal of the second scaled replica device are coupled to ground.

7. The differential amplifier of claim 5, wherein a third terminal of the first output driver device, a third terminal of the second output driver device, a third terminal of the first scaled replica device, and a third terminal of the second scaled replica device are coupled to a power signal.

8. The differential amplifier of claim 5, further comprising:
a capacitor coupled to the compare node.

9. The differential amplifier of claim 4, wherein a maximum current value for the threshold current is configured to be a scaled down version of a maximum acceptable current value for the third current and the fourth current.

10. The differential amplifier of claim 1, further comprising:
a thin oxide device coupled to a gate terminal of the first output driver device;
wherein a voltage of a gate terminal of the first scaled replica device is configured to increase if a decrease in a power supply voltage occurs; and
wherein the clamp circuit is configured to limit the third current through the first output driver device due to the increase in the voltage of the gate terminal of the first scaled replica device, thereby preventing damage to the thin oxide device due to the decrease in the power supply voltage.

11. A method for limiting an amplifier output current, comprising:
enabling a first current to flow through a first scaled replica device that is configured to be a replica of a first output driver device;
enabling a second current to flow through a second scaled replica device that is configured to be a replica of a second output driver device;
receiving a first driver input signal at a gate terminal of the first output driver device and a gate terminal of the first scaled replica device;
receiving a second driver input signal at a gate terminal of the second output driver device and a gate terminal of the second scaled replica device;
comparing a threshold current to the first current and the second current; and
limiting at least one of a third current through the first output driver device or a fourth current through the second output driver device based on said comparing, wherein said limiting includes coupling the first driver input signal to the second driver input signal.

12. The method of claim 11, wherein a second terminal of the first output driver device is coupled to a load, a second terminal of the second output driver device is couple to the load, a second terminal of the first scaled replica device is coupled to a compare node, a second terminal of the second scaled replica device is coupled to the compare node, a gate terminal of a first transistor is coupled to the compare node, and a current source is coupled to the compare node;
wherein said comparing comprises:
determining that the threshold current is greater than the sum of the first current and the second current if a voltage of the compare node decreases enough to turn on the first transistor.

13. The method of claim 12, wherein the first transistor has a source terminal coupled to the gate terminal of the first output driver device and the gate terminal of the first scaled replica device, and a drain terminal coupled to the gate terminal of the second output driver device and the gate terminal of the second scaled replica device;
wherein said coupling the first driver input signal to the second driver input signal comprises:
turning on the first transistor with the voltage of the compare node to create an electrically conductive path through the first transistor between the source and drain terminals.

14. The method of claim 12, further comprising:
receiving an increase in at least one of the third current through the first output driver device or the fourth current through the second output driver device due to a short circuit of the load;
receiving an increase in a gate voltage of at least one of the first output driver device or the second output driver device due to the received increase in at least one of the third current through the first output driver device or the fourth current through the second output driver device
receiving an increase in a gate voltage of at least one of the first scaled replica device or the second scaled replica device due to the received increase in the gate voltage of at least one of the first output driver device or the second output driver device; and
receiving a decrease in the voltage of the compare node due to the received increase of the gate voltage of at least one of the first scaled replica device or the second scaled replica device.

15. The method of claim 12, further comprising:
stabilizing a feedback loop that includes the first transistor and the first and second scaled replica devices.

16. The method of claim 11, wherein said limiting comprises:
limiting the third current through the first output driver device if a voltage of a gate terminal of the first scaled replica device increases due to a decrease in a power supply voltage, thereby preventing damage to a thin oxide device coupled to a gate terminal of the first output driver device.

17. The method of claim 11, wherein said limiting comprises:
limiting at least one of the third current through the first output driver device or the fourth current through the second output driver device if the threshold current is greater than at least one of the first current or the second current.

18. The method of claim 11, wherein said limiting comprises:
limiting at least one of the third current through the first output driver device or the fourth current through the second output driver device if the threshold current is less than at least one of the first current or the second current.

19. An electrical circuit, comprising:
a first scaled replica device configured to be a replica of a first output driver device of a differential amplifier;
a second scaled replica device configured to be a replica of a second output driver device of the differential amplifier;
a current source configured to generate a scaled threshold current;
a compare node; and
a clamp circuit;
wherein a gate terminal of the first output driver device and a gate terminal of the first scaled replica device receive a first driver input signal of the differential amplifier, and a gate terminal of the first output driver device and a gate terminal of the second scaled replica device receive a second driver input signal;

wherein a second terminal of the first scaled replica device, a second terminal of the second scaled replica device, the current source, and an input of the clamp circuit are coupled to the compare node; and wherein the clamp circuit configured to electrically couple the first driver input signal to the second driver input signal according to a voltage of the compare node.

20. The electrical circuit of claim 19, wherein the clamp circuit includes a first transistor having a first terminal coupled to the gate terminal of the first output driver device and the gate terminal of the first scaled replica device, and a second terminal coupled to the gate terminal of the second output driver device and the gate terminal of the second scaled replica device;

wherein a gate terminal of the first transistor is coupled to the compare node.

21. The electrical circuit of claim 20, wherein a second terminal of the first output driver device is coupled to a load;

wherein a second terminal of the second output driver device is coupled to the load.

22. The electrical circuit of claim 21, wherein a short circuit of the load causes an increase in at least one of the third current through the first output driver device or the fourth current through the second output driver device;

wherein an increase in a gate voltage of at least one of the first output driver device or the second output driver device is caused by the increase in at least one of the third current through the first output driver device or the fourth current through the second output driver device;

wherein an increase in a gate voltage of at least one of the first scaled replica device or the second scaled replica device is caused by the received increase in the gate voltage of at least one of the first output driver device or the second output driver device;

wherein a decrease in the voltage of the compare node is caused by the received increase of the gate voltage of at least one of the first scaled replica device or the second scaled replica device; and wherein the clamp circuit is configured to electrically couple the first driver input signal to the second driver input signal due to the decrease in the voltage of the compare node.

23. The electrical circuit of claim 21, wherein a third terminal of the first output driver device, a third terminal of the second output driver device, a third terminal of the first scaled replica device, and a third terminal of the second scaled replica device are coupled to ground.

24. The electrical circuit of claim 21, wherein a third terminal of the first output driver device, a third terminal of the second output driver device, a third terminal of the first scaled replica device, and a third terminal of the second scaled replica device are coupled to a power signal.

25. The electrical circuit of claim 19, further comprising:
a capacitor coupled to the compare node.

26. The electrical circuit of claim 19, wherein a maximum current value for the threshold current is configured to be a scaled down version of a maximum acceptable current through the first output driver device and through the second output driver device.

27. The electrical circuit of claim 19, wherein a voltage of a gate terminal of the first or second scaled replica device is configured to increase if a decrease in a power supply voltage occurs; and wherein the clamp circuit is configured to limit the third current through the first output driver device or the fourth current through the second output driver device due to the increase in the voltage of the gate terminal of the first or second scaled replica device, thereby preventing damage to a thin oxide device coupled to a gate terminal of the first output driver device due to the decrease in the power supply voltage.

* * * * *

UNITED STATES PATENT AND TRADEMARK OFFICE
CERTIFICATE OF CORRECTION

PATENT NO. : 7,714,655 B2 Page 1 of 1
APPLICATION NO. : 12/117987
DATED : May 11, 2010
INVENTOR(S) : Nir Matalon It is certified that error appears in the above-identified patent and that said Letters Patent is hereby corrected as shown below:

In column 14, line 20, in claim 14, after "device" insert -- ; --.

Signed and Sealed this

Tenth Day of August, 2010

David J. Kappos
*Director of the United States Patent and Trademark Office*